United States Patent
Jang et al.

(10) Patent No.: US 7,553,748 B2
(45) Date of Patent: Jun. 30, 2009

(54) SEMICONDUCTOR DEVICE AND METHOD OF MANUFACTURING THE SAME

(75) Inventors: Sung-Ho Jang, Gyeonggi-do (KR); Sang-Ho Song, Seoul (KR); Sung-Sam Lee, Gyeonggi-do (KR); Min-Sung Kang, Gyeonggi-do (KR); Won-Tae Park, Gyeonggi-do (KR); Min-Young Shim, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 159 days.

(21) Appl. No.: 11/463,812

(22) Filed: Aug. 10, 2006

(65) Prior Publication Data

US 2007/0042583 A1    Feb. 22, 2007

(30) Foreign Application Priority Data

Aug. 16, 2005    (KR) .................... 10-2005-0074771

(51) Int. Cl.
*H01L 21/20* (2006.01)
(52) U.S. Cl. .................. 438/586; 438/296; 438/564; 438/569; 438/578; 438/632; 257/E21.012; 257/E21.016; 257/E21.274; 257/E21.576; 257/E21.578
(58) Field of Classification Search .............. 438/197, 438/199, 216, 697; 257/E21.012–E21.016, 257/234, 245, 564, 576, 578, 598
See application file for complete search history.

(56) References Cited

U.S. PATENT DOCUMENTS 6,171,954 B1    1/2001    Hsu

2002/0163082 A1*  11/2002  Lee et al. .................... 257/758
2002/0185662 A1*  12/2002  Watatani .................... 257/200
2005/0014338 A1    1/2005  Kim et al.

FOREIGN PATENT DOCUMENTS

JP    10-233451    9/1998
JP    11-177089    7/1999

OTHER PUBLICATIONS

English language abstract of Korean Publication No. 10-233451.
English language abstract of Japanese Publication No. 11-177089.

* cited by examiner

*Primary Examiner*—Michael S Lebentritt
(74) *Attorney, Agent, or Firm*—Marger Johnson & McCollom, P.C.

(57) ABSTRACT

According to one embodiment, a gate structure including a gate insulation pattern, a gate pattern and a gate mask is formed on a channel region of a substrate to form a semiconductor device. A spacer is formed on a surface of the gate structure. An insulating interlayer pattern is formed on the substrate including the gate structure, and an opening is formed through the insulating interlayer pattern corresponding to an impurity region of the substrate. A conductive pattern is formed in the opening and a top surface thereof is higher than a top surface of the insulating interlayer pattern. Thus, an upper portion of the conductive pattern is protruded from the insulating interlayer pattern. A capping pattern is formed on the insulating interlayer pattern, and a sidewall of the protruded portion of the conductive pattern is covered with the capping pattern. Accordingly, the capping pattern compensates for a thickness reduction of the gate mask.

12 Claims, 9 Drawing Sheets

SEMICONDUCTOR DEVICE AND METHOD OF MANUFACTURING THE SAME

CROSS-REFERENCE TO RELATED APPLICATIONS

This application claims priority under 35 USC § 119 to Korean Patent Application No. 2005-74771 filed on Aug. 16, 2005, the contents of which are herein incorporated by reference in their entirety.

BACKGROUND

1. Technical Field

The disclosure relates to a semiconductor device and a method of manufacturing the semiconductor device. More particularly, example embodiments relate to a semiconductor device including a self-aligned contact pad and a method of manufacturing the semiconductor device including the self-aligned contact pad.

2. Description of the Related Art

As semiconductor devices have become highly integrated, widths of patterns and intervals between the patterns have become decreased in the semiconductor devices. Thus, as a width of a pattern (i.e., design rule) decreases, a length of a channel region in a metal-oxide semiconductor (MOS) transistor is shortened. When the channel is shorter than an effective length required for an operation of the MOS transistor, a short channel effect may occur at the channel of the MOS transistor, to thereby deteriorate electrical characteristics of the MOS transistor. Therefore, the MOS transistor requires a gate structure having a sufficient channel length to minimize short channel effects.

To prevent the short channel effect and to improve operation performance of the MOS transistor, a recessed channel has been developed and a transistor including the recessed channel is now under mass production. For example, U.S. Patent Application Publication No. 2005-0014338 discloses a semiconductor device including the recessed channel and a method of manufacturing the same.

The above recessed channel gives a sufficiently satisfying solution to problems due to a short effective length of the channel. However, the recessed channel also causes various processing problems due to a high ratio of a height with respect to a width of a gate. FIG. 1 is a cross-sectional view illustrating a conventional semiconductor device including a recessed channel.

Referring to FIG. 1, a conventional semiconductor device includes a substrate 10, a gate insulation layer 16, a gate structure 17 and a spacer 24.

The substrate 10 includes an isolation layer 12 and a recess portion 14. The gate insulation layer 16 is continuously formed on the recess portion 14 of the substrate 10. The gate structure 17 includes a first gate pattern 18, a second gate pattern 20 and a mask pattern 22 for forming the first and the second gate patterns. The first and the second gate patterns 18 and 20, which are sequentially formed on the gate insulation layer 16, may serve as a word line of the semiconductor device. For example, the first gate pattern 18 comprises doped polysilicon, and the second gate pattern 20 comprises tungsten silicide. The mask pattern comprises a nitride such as silicon nitride and silicon oxynitride. The spacer 24 is positioned on a sidewall of the gate structure 17. The spacer 24 may protect the first and the second gate patterns 18 and 20 in a subsequent self-aligned contact (SAC) process.

A conductive pattern 30 is formed on the gate insulation layer 16 between the gate structures adjacent to each other through the SAC process, so that the width of the gate structure 17 becomes very small. For that reason, an aspect ratio, which is the ratio of a height with respect to a width of the gate structure 17, becomes very high in the conventional semiconductor device. Particularly, an insulating interlayer 26 is formed on a resultant structure including the gate structure 17 to a sufficient thickness to cover the gate structures 17, and the insulating interlayer 26 is partially etched from the resultant structure to form an opening 28 through which an impurity region (not shown) is exposed. Since the opening 28 is formed through an anisotropic etching process against the insulating interlayer 26 having an etching selectivity with respect to the mask pattern 26 and the spacer 24, damage is easily caused to the first and second gate patterns 18 and 20 in the anisotropic etching process. Therefore, the mask pattern 22 requires a great thickness substantially identical to an overall height of the first and the second gate patterns 18 and 20 for prevention of the damage to the first and the second gate patterns 18 and 20 in the above etching process. As a result, the mask pattern 24 is necessarily formed to be high and a width of the gate structure 17 tends to be small due to a high integration degree, so that the aspect ratio of the gate structure 17 necessarily becomes high.

However, the opening 28 through which the impurity region of the substrate 10 is exposed is difficult to form in the insulating interlayer 26 due to the high aspect ratio of the gate structure 17. Furthermore, a shoulder portion, or a top edge portion, of the gate structure 17 becomes so weak from a structural viewpoint due to the high aspect ratio, that an electrical short circuit is generated between the first and second gate patterns 18 and 20 and a conductive pattern 30 in the opening 28. What is worse, the gate structure 17 may be broken due to stress at an interface between the second gate pattern 20 comprising tungsten silicide and the mask pattern 22.

In addition, the spacer usually comprises a dielectric material having a relatively high dielectric constant, such as silicon nitride, so as to facilitate the SAC process. However, there is a problem in that the dielectric material having a relatively high dielectric constant generates a large parasitic capacitance around the word line as a width of the word line becomes small.

SUMMARY

Example embodiments provide semiconductor devices including a gate structure, of which an aspect ratio is small, to thereby facilitate a manufacturing process of the semiconductor devices. Some embodiments provide methods of manufacturing the above semiconductor devices.

BRIEF DESCRIPTION OF THE DRAWINGS

The above and other features and advantages of the invention will become more apparent by describing example embodiments thereof with reference to the accompanying drawings, in which.

DETAILED DESCRIPTION OF EXAMPLE EMBODIMENTS

Figure 1:
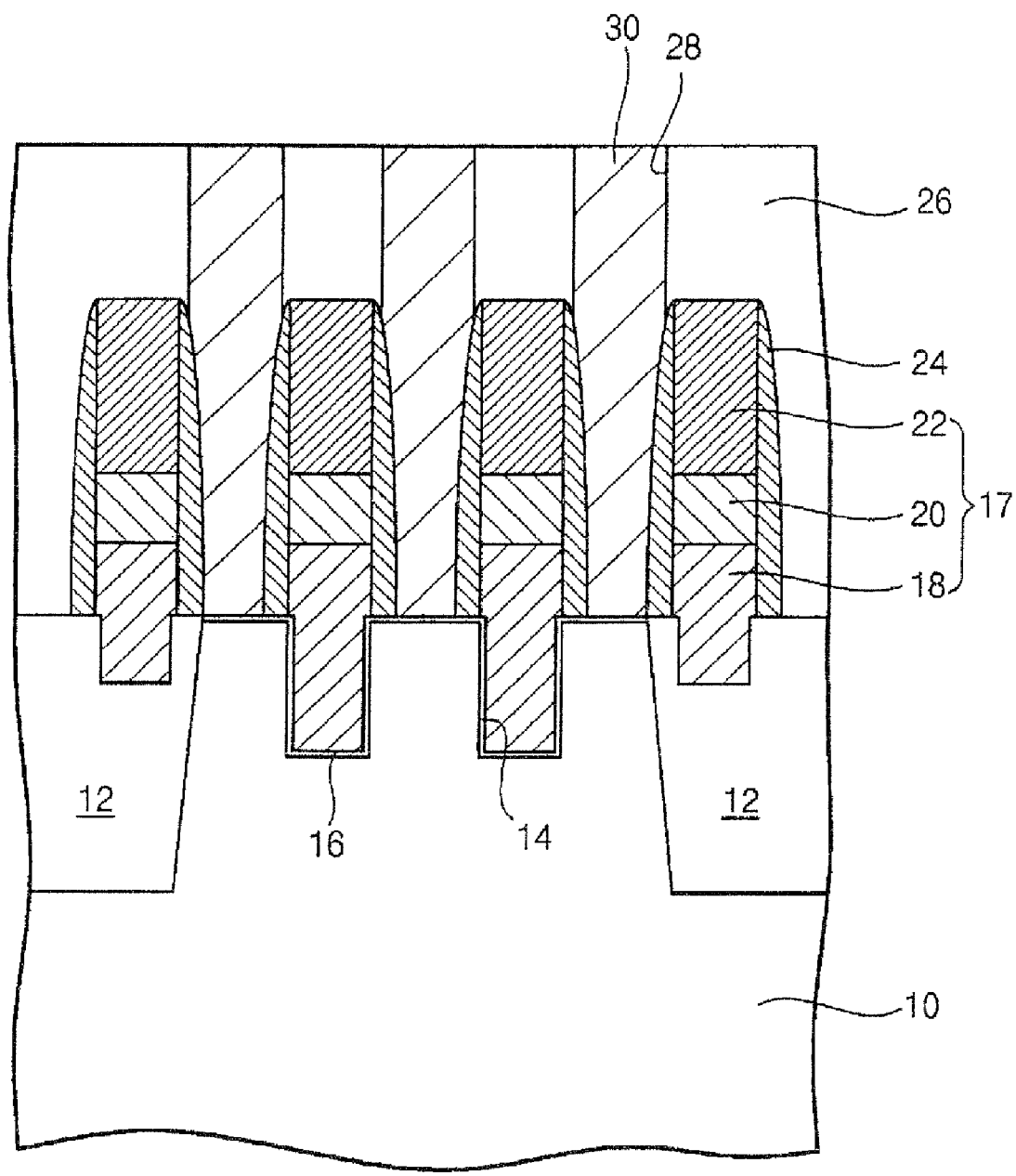
FIG. 1 is a cross-sectional view illustrating a conventional semiconductor device including a recessed channel.

The invention is described more fully hereinafter with reference to the accompanying drawings, in which example embodiments are shown. The invention may, however, be embodied in many different forms and should not be construed as limited to the example embodiments set forth herein. Rather, these example embodiments are provided so that this disclosure will be thorough and complete, and will convey the scope of the invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer, or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-section illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
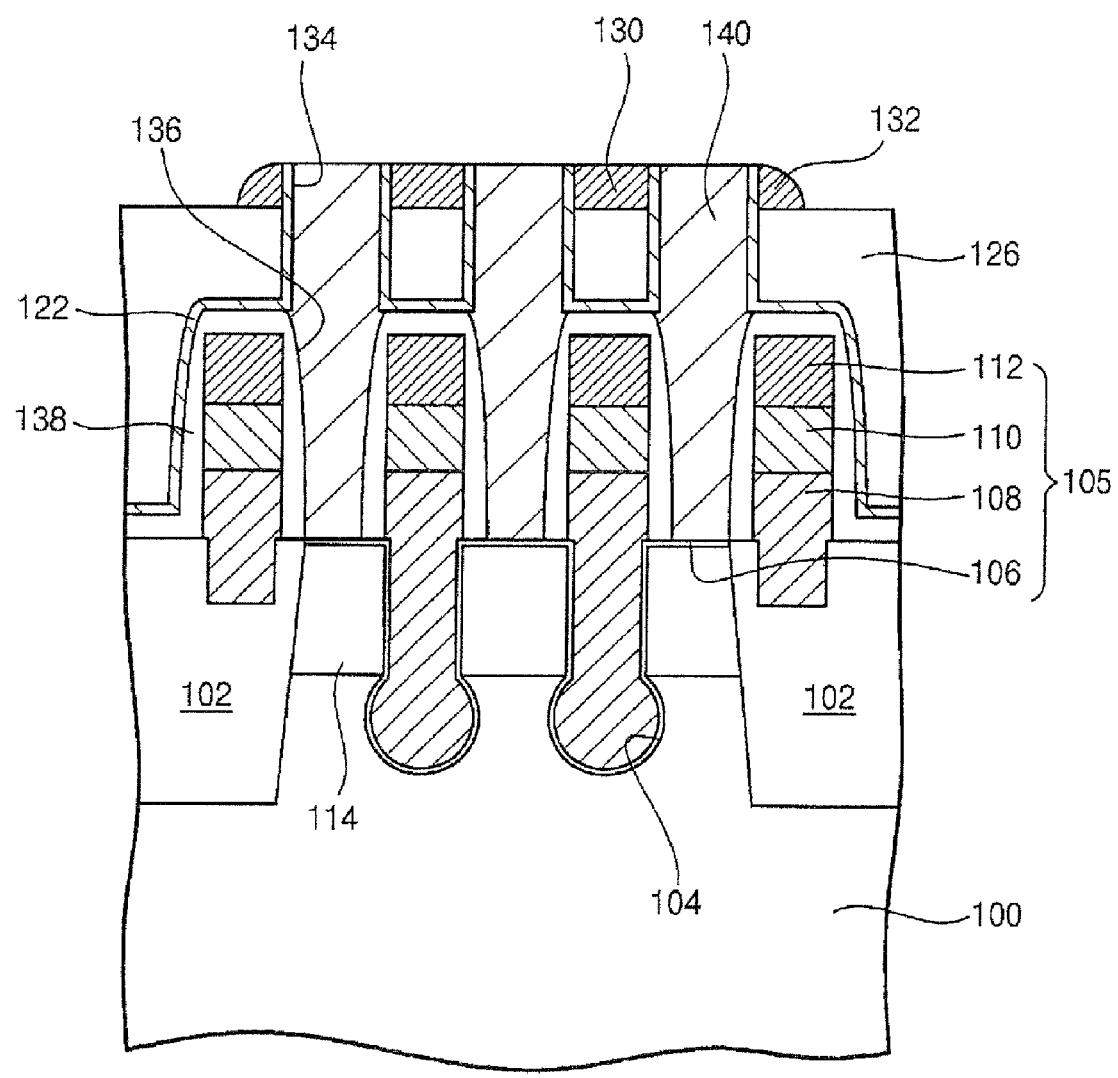
FIG. 2 is a cross-sectional view illustrating a semiconductor device in accordance with some embodiments.

FIG. 2 is a cross-sectional view illustrating a semiconductor device in accordance with some embodiments.

Referring to FIG. 2, a semiconductor device includes a semiconductor substrate 100, a gate structure 105, a spacer 138, an insulating interlayer 126, a conductive pattern 140 and a capping layer pattern 130.

The semiconductor substrate 100 may include a silicon substrate or a silicon-on-glass (SOG) substrate. The semiconductor substrate 100 includes an isolation layer 102 that is formed on an upper portion of the semiconductor substrate 100. The isolation layer 102 may divide the semiconductor substrate 100 into a field region and an active region.

The gate structure 105 is formed on the active region of the semiconductor substrate 100. The gate structure 105 may include a gate insulation layer pattern 106, a first gate pattern 108, a second gate pattern 110 and a mask pattern 112 that are sequentially stacked on the semiconductor substrate 100. The gate structure 105 may work as a word line that may be employed to the semiconductor device. A passing gate (not shown) may be further formed on the isolation layer 102. The passing gate may be extended from the gate structure 105.

In the present embodiment, the gate structure 105 may extend to a position below a top surface of the substrate 100. Particularly, a recess 104 is formed in the substrate 100 of the active region, and the gate structure 105 extends into the recess 104 of the substrate 100. Accordingly, although a width of the gate structure 105 is no more than about 90 nm, the gate structure 105 may have a sufficient channel length because the gate structure 105 extends below the top surface of the substrate 100. While the present embodiment discloses a recessed channel array transistor, of which the gate structure extends into the recess 104 of the substrate and is partially filled into the recess 104 of the substrate, any other transistor such as a planar type transistor and a fin field-effect transistor (FinFET) may also include the same gate structure as in the present embodiment, as would be known to one of ordinary skill in the art. An impurity region 114 is formed at a surface portion of the substrate 100 neighboring the recess 104, and the channel region (not shown) is formed on a surface of the recess 104 of the substrate 100 between the neighboring recesses 114.

In the present embodiment, a thickness ratio between the mask pattern 112 and a gate pattern including the first and the second gate patterns 108 and 110 ranges from about 1:2 to about 1:4. Although a width of the word line is reduced due to a high degree of integration, the thicknesses of the first and second gate patterns 108 and 110 are not reduced, so that an electrical resistance of the word line is prevented from increasing despite the width reduction of the word line. Thus, an aspect ratio of the gate structure 105 is decisively varied in accordance with a thickness of the mask pattern 112. When the thickness ratio between the mask pattern 112 and the gate pattern is over about 1:4, the aspect ratio of the gate structure 105 is so high that various defects tend to occur in a process for formation of the gate structure 105. In addition, when the thickness ratio of the mask pattern 112 and the gate pattern is below about 1:2, the mask pattern 112 does not sufficiently protect the first and second gate patterns 108 and 110 in a subsequent process.

For example, when the width of the gate structure 105 is in a range of about 40 nm to about 60 nm, the mask pattern 112 has a thickness of about 500 Å to about 1500 Å under the conditions in which the first gate pattern 108 has a thickness of about 500 Å to about 1,500 Å from the surface of the substrate 100, and the second gate pattern 110 has a thickness of about 500 Å to about 1,500 Å from a surface of the first gate pattern 108.

The spacer 138 is formed on a surface of the gate structure 105. The spacer 138 may comprise a material having a relatively low dielectric constant. For example, the spacer 138 comprises an oxide such as silicon oxide. When the spacer 138 comprises silicon oxide, a parasitic capacitance between the word lines adjacent to each other may significantly decrease as compared with when the spacer comprises silicon nitride.

The insulating interlayer pattern 126 is formed on a resultant structure including the gate structure 105 and the spacer 138. The insulating interlayer pattern 126 includes an opening 136 though which the impurity region 114 is exposed. The opening 136 is defined by the insulating interlayer pattern 126, the spacer 138 and the impurity region 114.

The conductive pattern 140 is positioned in the opening 136 in such a way that a top surface of the conductive pattern 140 is substantially higher than a top surface of the insulating interlayer pattern 126. The conductive pattern 140 is electrically connected to the impurity region 114. In the present embodiment, the conductive pattern 140 may include polysilicon doped with impurities.

In one example embodiment, various passivation layers may be positioned on the insulating interlayer pattern 126, so that the gate structure 105 is sufficiently protected in a subsequent process, although the mask pattern 112 is formed to a relatively small thickness. Firstly, an etch stop layer 122 is interposed between the insulating interlayer pattern 126 and the spacer 138 and between the insulating interlayer pattern 126 and the conductive pattern 140. The etch stop layer 122 may include silicon nitride. The etch stop layer 122 may have a thickness of about 30 Å to about 200 Å. Secondly, the capping layer pattern 130 is positioned on the insulating interlayer pattern 126 to surround a surface of an upper portion of the conductive pattern 140 that is protruded from the insulating interlayer pattern 126. The capping layer pattern 130 may include silicon nitride, and is formed to a thickness of about 500 Å to about 1,000 Å. In the present embodiment, the capping layer pattern 130 may include a capping layer spacer 132 surrounding the active region of the substrate 100. Thus, a group of the conductive patterns 140 in the active region are surrounded by the capping layer spacer 132 at a top portion thereof. In a modified example embodiment, a modified capping layer pattern (not shown) may be positioned on the insulating interlayer pattern 126 at a uniform thickness without the capping layer spacer 132 in such a structure that the conductive pattern 140 is exposed through the modified capping layer pattern.

Accordingly, damage to the gate structure 105 is sufficiently prevented in a subsequent anisotropic etching process for formation of a contact plug that makes electrical contact with the conductive pattern 140 by the etch stop layer 122 and the capping layer pattern 130. That is, the capping layer pattern 130 and the etch stop layer 122 may sufficiently compensate for reduction of an etching margin due to a reduction of the thickness of the mask pattern 112.

According to some example embodiments, a thickness of a mask pattern of a gate structure is significantly reduced. An etch stop layer and a capping layer pattern are further positioned on a resultant structure including the gate structure to a sufficient thickness to compensate for reduction of an etching margin due to the reduction of thickness of the mask pattern, thereby significantly improving an aspect ratio of the gate structure. As a result, a height of the gate structure may be reduced in proportion to a width reduction of the gate structure, so that processing defects caused by a high aspect ratio are sufficiently prevented in the gate structure.

FIGS. 3 to 7 are cross-sectional views illustrating processing steps for a method of manufacturing a semiconductor device according to some embodiments.

Figure 3:
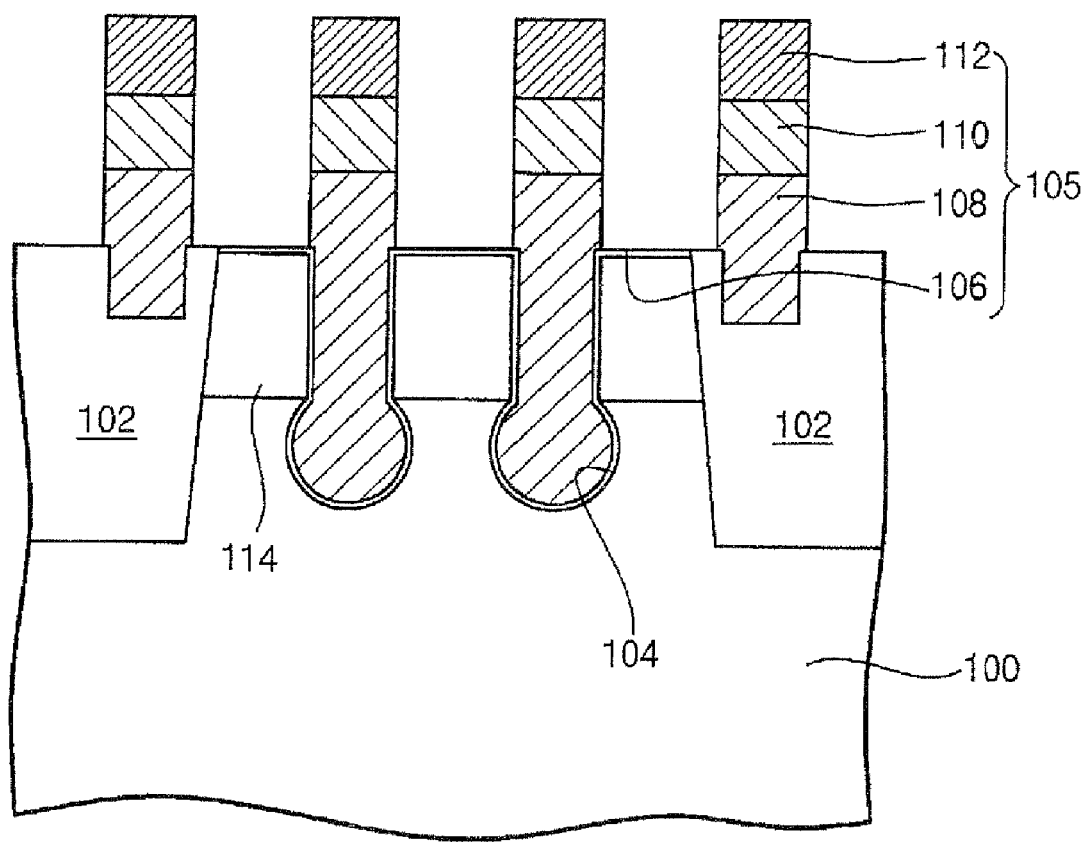
FIGS. 3 to 7 are cross-sectional views illustrating a method of manufacturing a semiconductor device according to some embodiments.

Referring to FIG. 3, a substrate 100, such as a silicon wafer, is provided and is divided into an active region in which various conductive structures (not shown) are formed and a field region surrounding the active region. An insulation layer 102 is formed in the field region of the semi conductor substrate 100, so that the conductive structures in the active regions adjacent to each other are electrically isolated from each other by the insulation layer in the field region. Hereinafter, the insulation layer in the field region is referred to as a device isolation layer. The device isolation layer may be formed by a shallow trench isolation (STI) process or a local oxidation isolation (LOCOS) process.

A preliminary recess (not shown) may be formed in the active region of the semiconductor substrate 100. A hard mask pattern (not shown) is formed on the semiconductor substrate 100 corresponding to a region for the preliminary recess, and an anisotropic etching process is performed on the substrate 100 using the hard mask pattern as an etching mask, thereby forming the preliminary recess on the substrate 100. A passivation layer pattern (not shown) may be formed on a surface of the preliminary recess, and an isotropic etching process is performed in the preliminary recess. As a result, a bottom portion of the preliminary recess is isotropically etched so that a size of the bottom portion of the preliminary recess is greater than that of an upper portion of the preliminary recess, to thereby complete a recess 104 in the active region of the substrate 100.

A gate insulation layer pattern 106 is continuously formed on a top surface of the substrate 100 in the active region and on an inner surface of the recess 104 to a uniform thickness. For example, the gate insulation layer pattern 106 may comprise silicon oxide.

A first gate layer (not shown) is formed on the semiconductor substrate 100 including the recess 104 to a sufficient thickness to fill up the recess 104, and a second gate layer (not shown) is formed on the first gate layer. In an example embodiment, the first gate layer may comprise doped polysilicon, whereas the second gate layer may comprise tungsten (W) or tungsten silicide.

A mask layer (not shown) is formed on the second gate layer. The mask layer may comprise a nitride such as silicon nitride and silicon oxynitride. A photoresist pattern (not shown) may be formed on the mask layer, and the mask layer is partially and anisotropically etched using the photoresist pattern as an etching mask to form a mask pattern 112 on the second gate layer.

The first and the second gate layers are partially and sequentially etched using the mask pattern 112 as an etching mask to form a first gate pattern 108 and a second gate pattern 110 on the semiconductor substrate 100. Thus, a gate structure 105 including the gate insulation layer pattern 106, a gate pattern having the first and second gate patterns 108 and 110 and the mask pattern 112 is formed on the semiconductor substrate 100.

Impurities are implanted onto the substrate 100 using the gate structure 105 as an implantation mask, so that impurity regions 114 are formed at surface portions of the substrate 100 around the gate structure 100. Source/drain regions may be formed on the impurity regions in a subsequent process. While the above example embodiment discloses that the impurity regions 114 are formed after the recess is formed, the impurity regions may also be formed prior to the recess, as would be known to one of ordinary skill in the art. Regardless of the formation order of the impurity regions 114 with respect to the recess 104, the impurity regions are separated by the recess, and each of the separated impurity regions functions as a source region and a drain region, respectively. As a result, a channel region (not shown) is formed between the source/drain regions along an inner surface of the recess 104.

In the present embodiment, the mask pattern 112 is formed to a relatively thin thickness, so that an overall height of the gate structure 105 may be reduced. Particularly, the mask pattern 112 is formed to such a thickness that a thickness ratio between the mask pattern and a gate pattern including the first and second gate patterns 108 and 110 ranges from about 1:2 to about 1:4. For example, when the width of the gate structure 105 is in a range of about 40 nm to about 60 nm, the mask pattern 112 has a thickness of about 400 Å to about 800 Å under the conditions in which the first gate pattern 108 has a thickness of about 600 Å from the surface of the substrate 100, and the second gate pattern 110 has a thickness of about 1,000 Å from a surface of the first gate pattern 108. When the mask pattern 112 is formed on the second gate pattern 110 to a thickness of over about 800 Å, the aspect ratio of the gate structure 105 is so high that various defects tend to occur in a process for formation of the gate structure 105. In addition, when the mask pattern 112 is formed on the second gate pattern 110 to a thickness of below about 400 Å, the mask pattern 112 does not sufficiently protect the first and second gate patterns 108 and 110 in a subsequent process.

Figure 4:
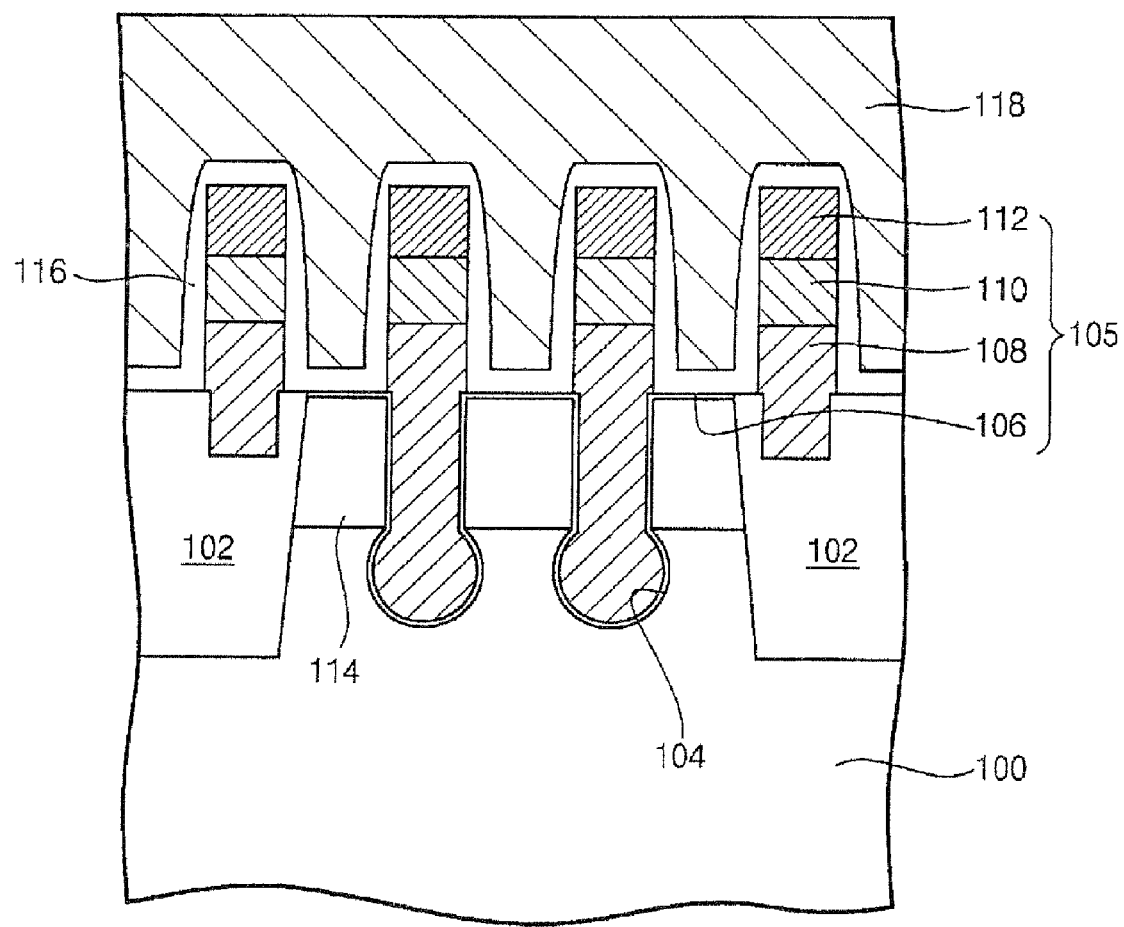
Figure 7:
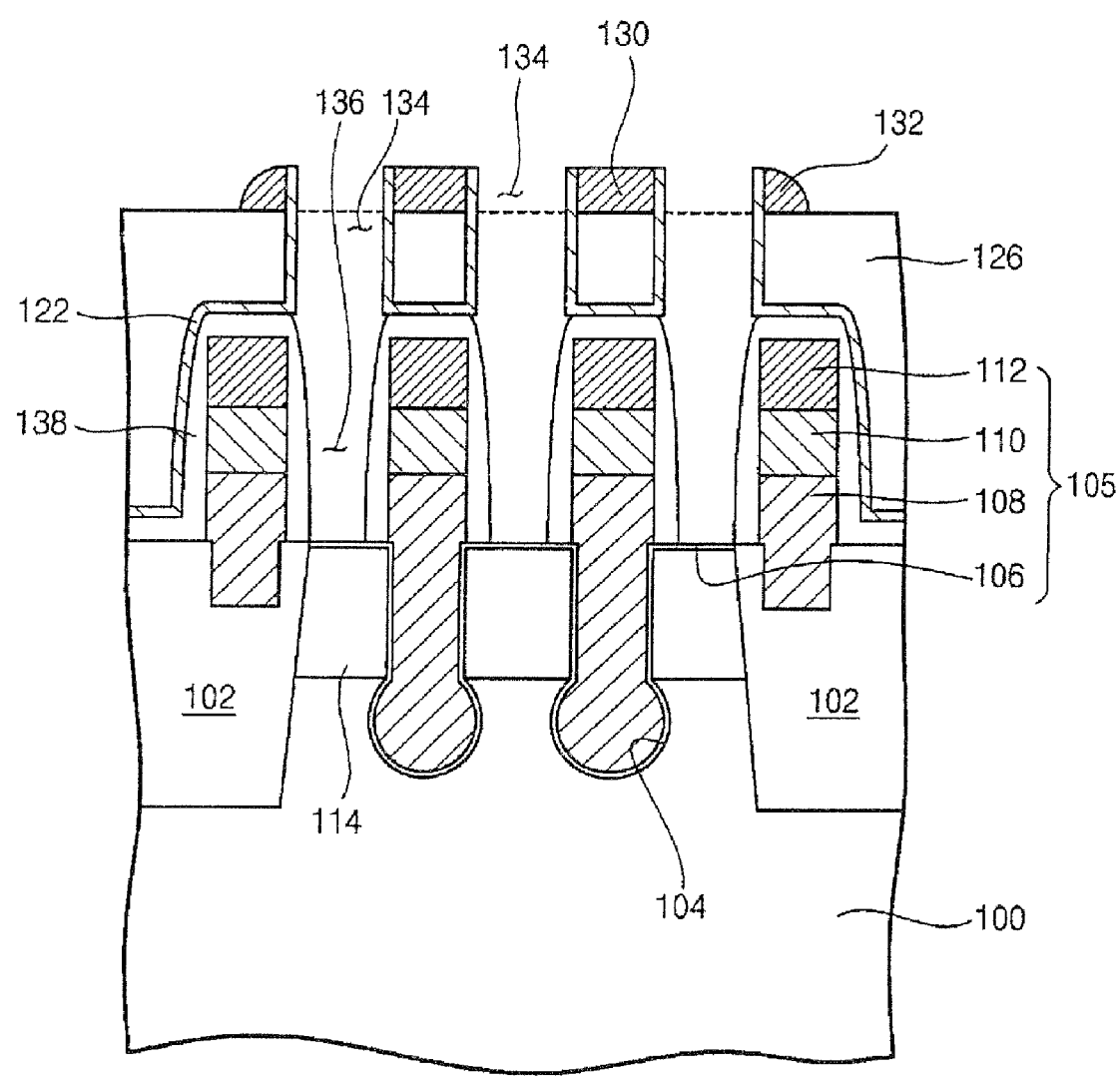

Referring to FIG. 4, a spacer layer 116 for a formation of a spacer 138 in FIG. 7 is formed on the substrate 100 including the gate structure 105, so that the spacer layer 116 is formed on a top surface of the substrate 100 and an outer surface of the gate structure 105. In the present embodiment, the spacer layer 116 may comprise a material having a relatively low dielectric constant, such as silicon oxide. A dummy layer 118 is formed on the spacer layer 16 to a sufficient thickness to fill up a gap between adjacent gate structures 105. In the present embodiment, the dummy layer 118 has an etching selectivity with respect to both the spacer layer 116 and an insulating interlayer (not shown) that is to be formed in a subsequent process, so that the spacer layer 116 and the insulating interlayer are hardly etched in an etching process for removing the dummy layer 118. For example, when the spacer layer 116 and the insulating; interlayer comprise an oxide such as silicon oxide, the dummy layer 118 may comprise polysilicon or silicon germanium.

The dummy layer 118 may be further removed by a planarization process such as a chemical mechanical polishing (CMP) process, so that a top surface of the dummy layer 118 is planarized to a predetermined thickness.

Figure 5:
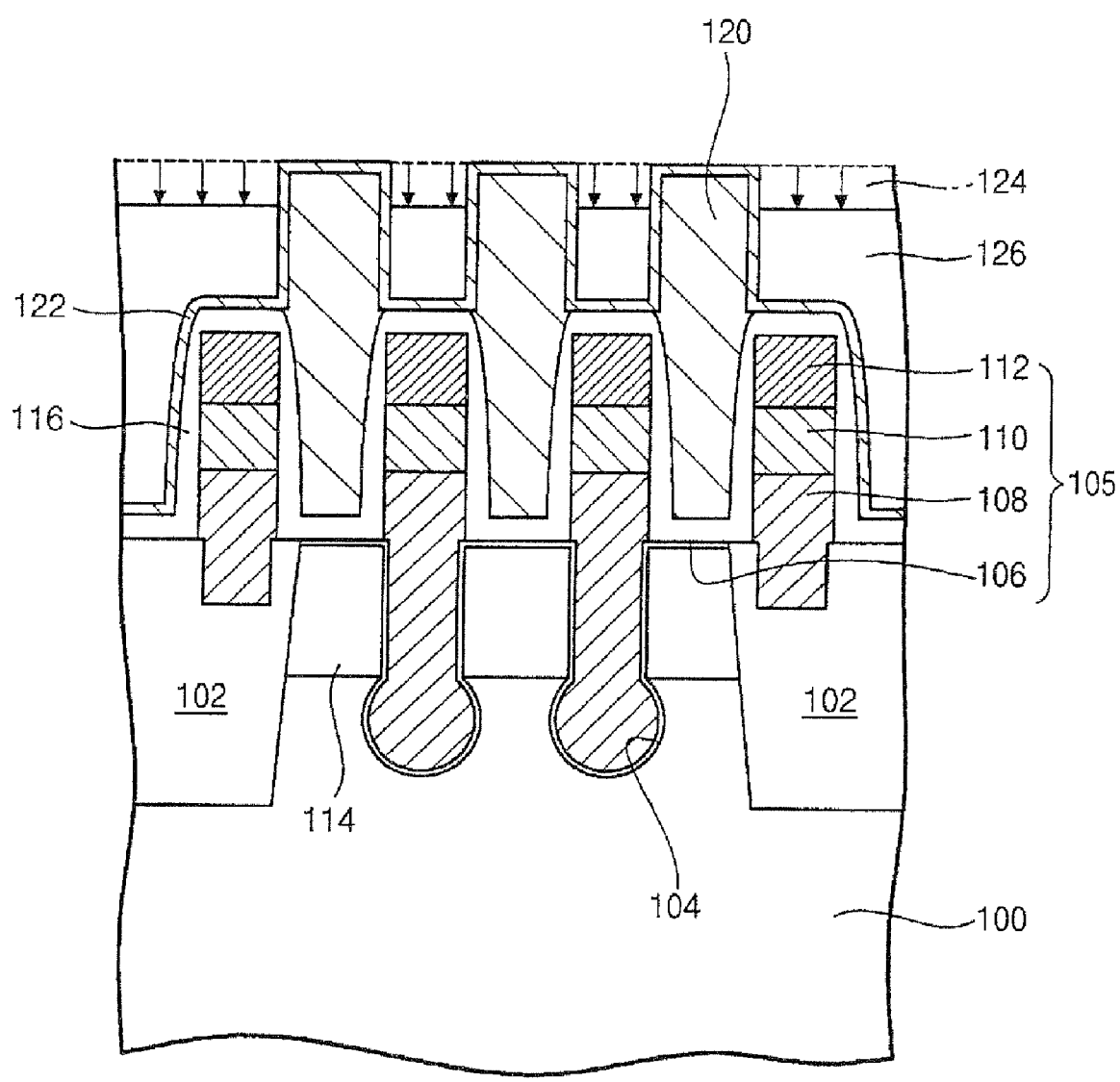

Referring to FIG. 5, a photoresist pattern (not shown) is formed on the planarized dummy layer 118, and the dummy layer 118 is partially etched from the substrate 100 using the photoresist pattern as an etching mask, so that only the dummy layer remains on the region corresponding to the gap between the gate structures 105, thereby forming a dummy pattern 120 over each of the impurity regions 114. As a result, a bottom of the dummy pattern 120 makes contact with the spacer layer 116 in the gap between the gate structures 105, and a top surface of the dummy pattern 120 is much higher than a top portion of the gate structure 105, so that the dummy pattern 120 is spaced apart and isolated from the neighboring dummy pattern by the gate structure 105. The dummy pattern 120 is removed from the substrate 100, to thereby form a contact hole (not shown) through which the impurity regions 114 are exposed in a subsequent process. A conductive pattern (not shown) is filled into the contact hole and is electrically connected to the impurity regions 114.

An etch stop layer 122 is continuously formed on a surface of the spacer layer 116 and on a surface of the dummy pattern 120. In the present embodiment, the etch stop layer 122 may comprise a nitride such as silicon nitride and is formed to a thickness of about 30 Å to 200 Å. The insulating interlayer 124 is formed on the etch stop layer 122 to a sufficient thickness to cover the dummy pattern 120. The insulating interlayer 124 may comprise silicon oxide or spin-on-glass (SOG). The etch stop layer 122 may prevent damage to the spacer layer 116 and the gate structure 105 in a subsequent etching process.

The insulating interlayer 124 is partially removed from the substrate 100 by a planarization process until a top surface of the etch stop layer 122 is exposed, so that the insulating interlayer 124 is separated from each other by the dummy pattern 120 which is covered with the etch stop layer 122, thereby forming an insulating interlayer pattern 126. The planarization process may include a CMP process, an etch-back process and a combination of the CMP process and the etch-back process. Then, an upper portion of the insulating interlayer pattern 126 is further removed from the etch stop layer 122 by an anisotropic etching process against the whole surface of the insulating interlayer pattern 126, for example an etch-back process, so that an upper surface of the etch stop layer 122 is exposed and the upper portion of the dummy pattern 120 is protruded from the insulating interlayer pattern 120.

Figure 6:
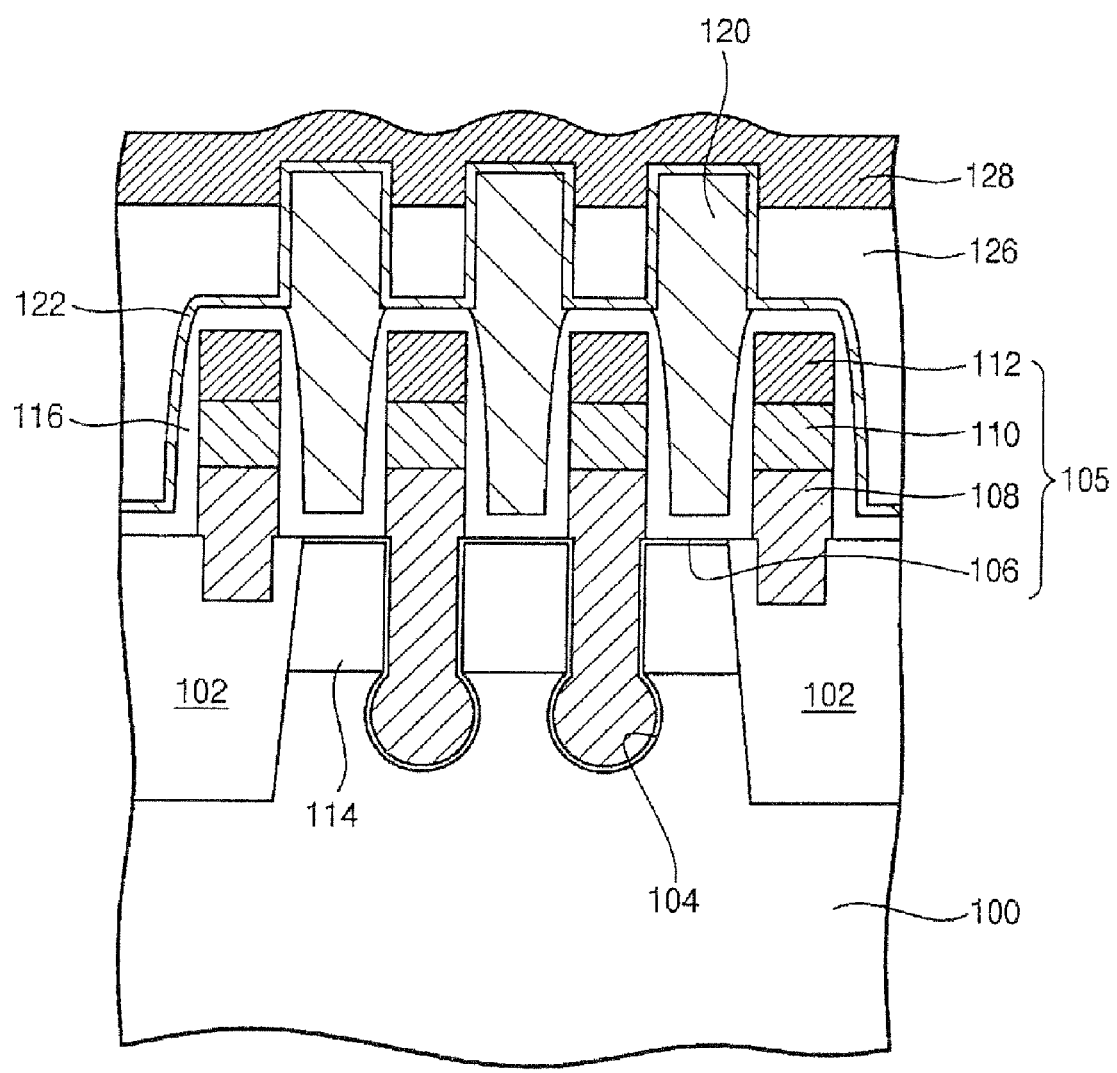

Referring to FIGS. 6 and 7, a capping layer 128 is formed on the insulating interlayer pattern 126 to a sufficient thickness to cover the protruded upper portion of the dummy pattern 120. The capping layer 128 may comprise a material having an etching selectivity with respect to the insulating interlayer pattern 126 and the dummy pattern 120. For example, the capping layer comprises a nitride such as silicon nitride.

The capping layer 128 is removed from the insulating interlayer pattern 126 by a planarization process until a top surface of the dummy pattern 120 is exposed, thereby forming a capping layer pattern 130. In the present embodiment, an anisotropic etching process is performed against a whole surface of the capping layer 128 until the top surface of the dummy pattern 120 is exposed, so that the capping layer 128 remains on the insulating interlayer pattern 126 while making contact with the etch stop layer 122. Particularly, the capping layer 128 is formed into a capping spacer 132 at a peripheral portion of the active region of the substrate 100. That is, the capping spacer 132 makes contact with the etch stop layer 122 corresponding to the protruded upper portion of the dummy pattern 120, so that a group of the dummy patterns 120 in the active region are surrounded by the capping spacer 132. In the present embodiment, the group of the dummy patterns 120 includes three dummy patterns 120. The dummy pattern 120 is removed from the substrate 100 in a subsequent etching process.

The dummy pattern 120 is removed from the substrate 100 by an etching process against the exposed top surface thereof. In the present embodiment, the etching process includes a wet etching process in which the substrate 100 including the dummy pattern 120 is dipped into an etchant for a predetermined time. The insulating interlayer pattern 126 and the spacer layer 116 are hardly removed from the substrate 100 in the above wet etching process using the etchant. For example, when the insulating interlayer pattern 126 and the spacer layer 116 comprise silicon nitride and the dummy pattern 120 comprise polysilicon, the wet etching process may be performed using a new standard cleaning-1 (NSC-1) solution at a temperature of below about 80° C. The NSC-1 solution contains ammonium hydroxide ($NH_4OH$), hydrogen peroxide ($H_2O_2$) and deionized water at a molar ratio of about 4:1:95. In the above case, an etching selectivity between polysilicon and oxide may be about 12.5:1. The above wet etching process may also be performed using a standard cleaning-1 (SC-1) solution at a temperature below about 70° C. The SC-1 solution contains ammonium hydroxide ($NH_4OH$), hydrogen peroxide ($H_2O_2$) and deionized water at a molar ratio of about 1:4:20. In the above case, an etching selectivity between polysilicon and oxide may be about 5.5:1.

When the dummy pattern 120 is removed from the substrate 100, the spacer layer 116 on the impurity regions 114 is exposed to surroundings. The spacer layer 116 is also removed from the substrate 100 so that the impurity regions 114 are exposed to surroundings. Therefore, a contact hole 136 is formed between the gate structures 105 and is defined by the impurity region 114, the spacer 138, the insulating interlayer pattern 126, the etch stop layer 122, and an opening 134, which is formed to be connected to the contact hole 136. The opening 134 is defined by the insulating interlayer pattern 126 and the capping layer pattern 130 that make contact with the etch stop layer 122.

Referring again to FIG. 2, a conductive layer (not shown) is filled into the opening 134 and the contact hole 136. The conductive layer is partially etched from the substrate 100 to form a conductive pattern 140 electrically connected to the impurity region 114.

As a result, the capping layer pattern 130 sufficiently prevents damage to the gate structure 105 in a subsequent etching process for formation of an opening in which a bit line contact plug (not shown) or a storage node contact plug (not shown), which is electrically connected to the conductive pattern 140, is formed. In other words, the capping layer pattern 130 and the etch stop layer 122 may sufficiently prevent damage to the first and second gate patterns 108 and 110 although a thickness of the mask pattern 112 is reduced.

Figure 8:
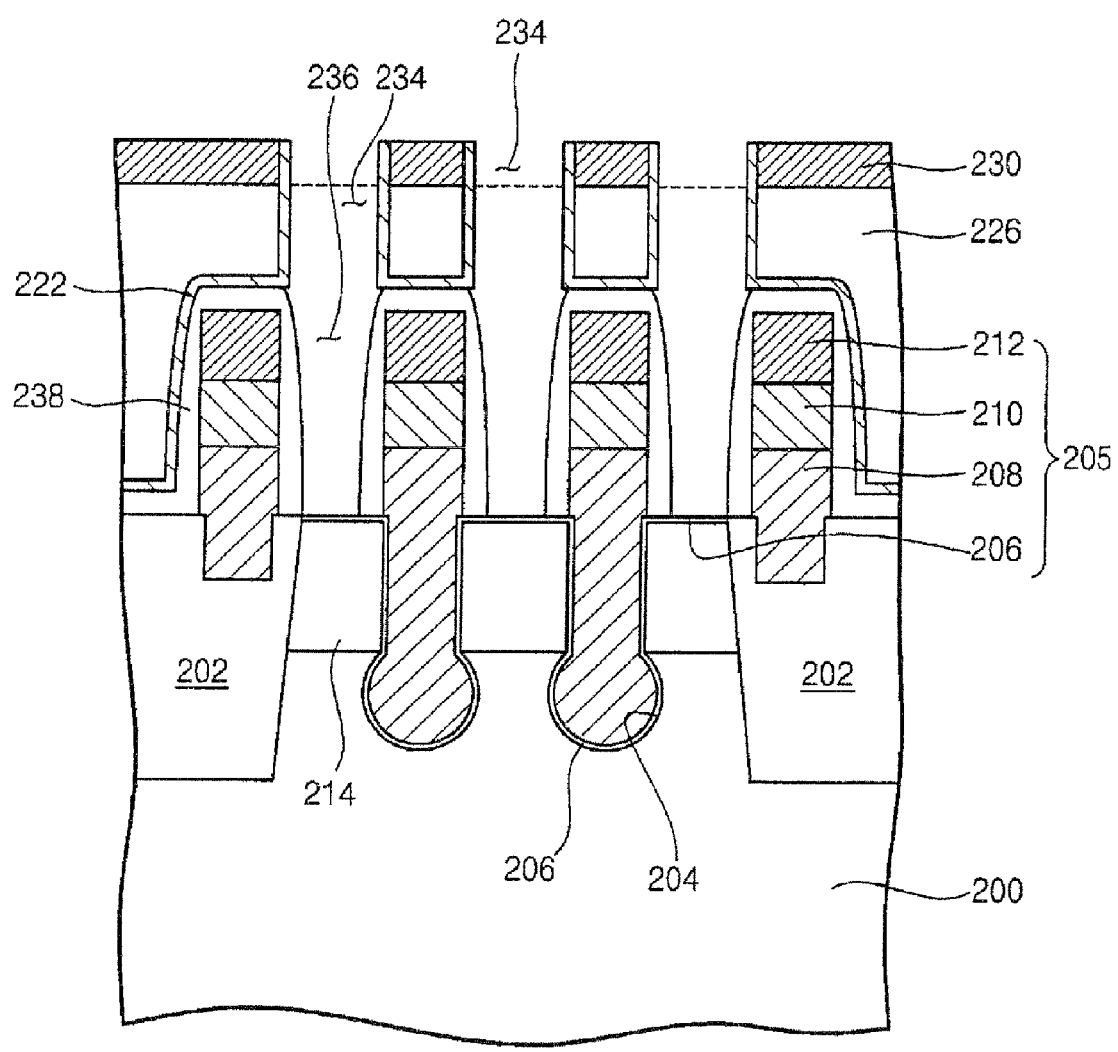
FIGS. 8 and 9 are cross-sectional views illustrating a method of manufacturing a semiconductor device according to some embodiments.
Figure 9:
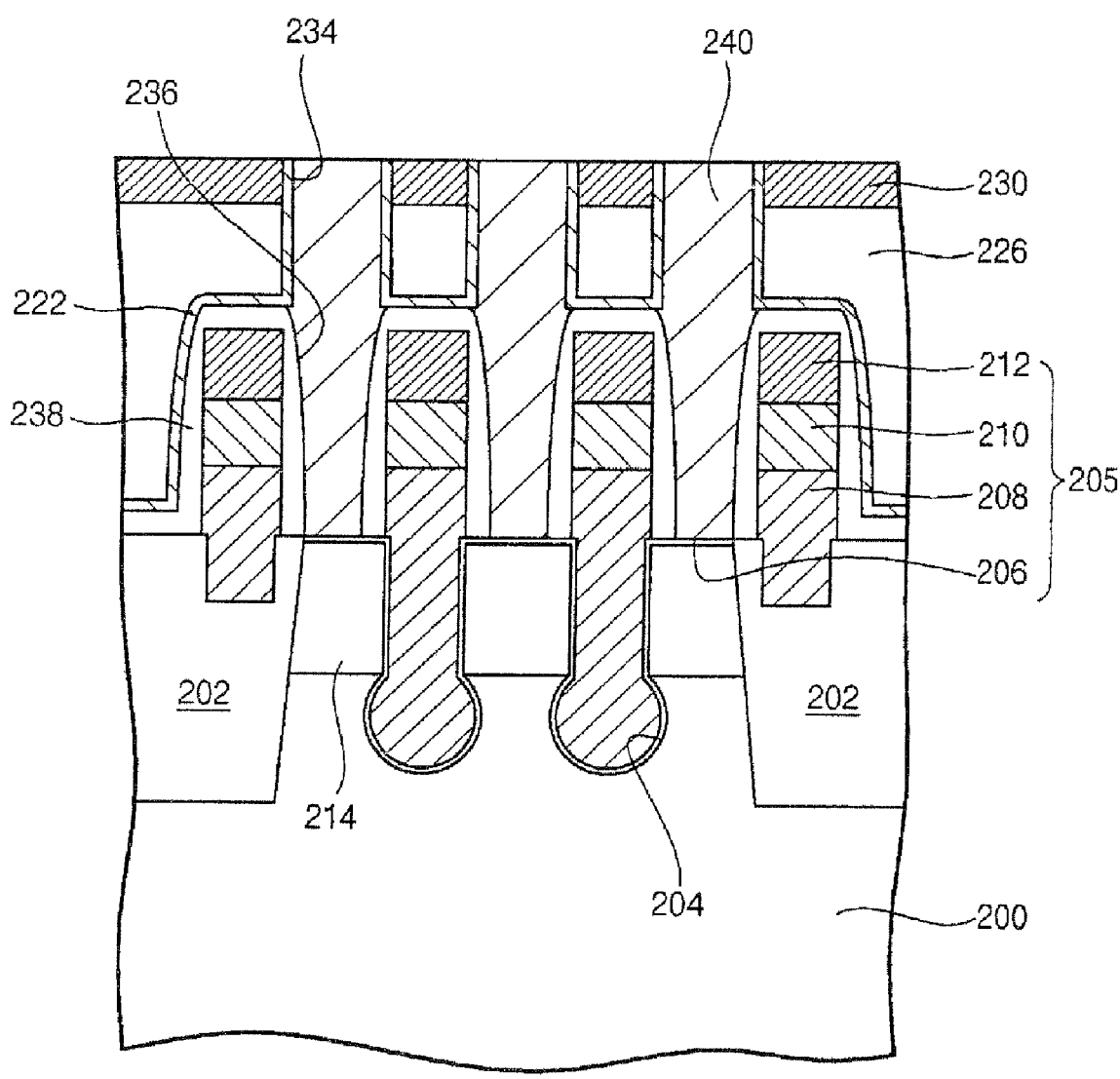

FIGS. 8 and 9 are cross-sectional views illustrating a method of manufacturing a semiconductor device according to some embodiments.

Referring to FIG. 8, a semiconductor substrate 200 including an isolation layer 202, a recess 204 and an impurity region 214 is provided. The isolation layer 202 may divide the semiconductor substrate 200 into an active region and a field region. A gate insulation layer 206 is formed on the semiconductor substrate 200 and an inner surface of the recess 204. A gate structure 205 including a first gate pattern 208, a second gate pattern 210 and a mask pattern 212 is formed on the gate insulation layer 206. A spacer 238 is formed on a surface of the gate structure 205. An insulating interlayer pattern 226 is formed on a resultant structure including the gate structure 205. The insulating interlayer pattern 226 has a contact hole 236 through which the impurity region 214 is exposed. A capping layer pattern 230 is formed on the insulating interlayer pattern 226. The capping layer pattern 230 includes an opening 234 connected to the contact hole 236.

The above configuration of the present embodiment is substantially the same configuration as described with reference to FIGS. 3 to 7, except for a capping layer pattern; thus, any further description of the above configurations of the present embodiment is omitted hereinafter in order to avoid redundancy.

While the capping layer pattern 130 in the previous embodiment includes a capping spacer 132 in FIG. 7, the capping layer pattern 230 is uniformly formed on the insulating interlayer pattern 226. In the present embodiment, a capping layer (not shown) is partially removed from the insulating interlayer pattern 226 by a planarization process such as CMP process until a top surface of the dummy pattern (not shown) is exposed, thereby forming the capping layer pattern 230.

Referring to FIG. 9, a conductive layer (not shown) is formed on the substrate 100 including the opening 234 and the contact hole 236 to a sufficient thickness to fill up the opening 234 and the contact hole 236, and is partially removed from the substrate 100 until a top surface of the capping layer pattern 230 is exposed, so that only the conductive layer remains in the opening 234 and the contact hole 236, to thereby form a conductive pattern 240 that is electrically connected to the impurity region 214.

As described above, the conductive pattern, which is positioned between the gate structures and is electrically connected to the impurity region, is formed in the opening and the contact hole through a process different from a conventional self-aligned contact (SAC) process. Accordingly, the gate structure according to some embodiments may be applied to a three-dimensional transistor such as a planar type transistor and a FinFET, as well as to a recessed channel array transistor.

In an example embodiment, a gate structure may have a relatively low aspect ratio and the gate spacer may include a material having a relatively low dielectric constant such as silicon oxide. Therefore, a semiconductor device may have improved reliability, and a production yield may increase in manufacturing the semiconductor device.

According to some embodiments, there is provided a semiconductor device. The semiconductor device includes a substrate including impurity regions and a channel region between the impurity regions. A gate structure is positioned on the channel region of the substrate and the gate structure includes a gate insulation layer pattern, a gate pattern and a gate mask sequentially stacked on the channel region of the substrate. A spacer is positioned on a surface of the gate structure, and an insulating interlayer pattern is positioned on the substrate to a thickness to cover the gate structure. The insulating interlayer pattern includes an opening through which one of the impurity regions is exposed. A conductive pattern is positioned in the opening and a top surface thereof is higher than a top surface of the insulating interlayer pattern, so that an upper portion of the conductive pattern is protruded from the insulating interlayer pattern. A capping layer pattern is positioned on the insulating interlayer pattern in such a structure that a sidewall of the protruded upper portion of the conductive pattern is covered with the capping layer pattern.

According to some embodiments, a thickness ratio between the mask pattern and the gate pattern may be in a range of about 1:2 to about 1:4.

According to some embodiments, the spacer may include silicon oxide.

According to some embodiments, an etch stop layer may be further interposed between the conductive pattern and the insulation layer pattern, and between the spacer and the insulation layer pattern. The etch stop layer may include silicon nitride.

According to some embodiments, the capping layer pattern may include silicon nitride.

According to some embodiments, the capping layer pattern may include a capping layer spacer surrounding a sidewall of the protrusion.

According to some embodiments, the thickness of the gate mask is reduced and an aspect ratio of the gate structure becomes sufficiently small, to thereby facilitate a manufacturing process of the semiconductor device. In addition, the gate spacer comprises a material having a low dielectric constant, such as silicon oxide, thereby reducing a parasitic capacitance of a word line.

According to one embodiment, there is provided a method of manufacturing a semiconductor device. A substrate including impurity regions and channel regions between the impurity regions is provided. A gate structure is formed on the channel region of the substrate. The gate structure includes a gate insulation layer pattern, a gate pattern and a mask pattern sequentially stacked on the channel region of the substrate. A spacer layer is continuously formed on a surface of the substrate and on a surface of the gate structure. An insulating interlayer pattern is formed on a resultant structure including the gate structure. The insulating interlayer pattern includes a contact hole through which one of the impurity regions is exposed. A capping layer pattern is formed on the insulating interlayer pattern. The capping layer pattern includes an opening connected to the contact hole. A conductive pattern is formed in the opening and the contact hole.

In an example embodiment, the insulating interlayer pattern is formed as follows. A dummy layer is formed on the resultant structure including the gate structure. A dummy pattern is formed on the substrate by patterning the dummy layer in such a structure that the dummy layer remains on the impurity regions defined by the gate structure, of which the surface is covered with the spacer, so that the dummy pattern extends substantially perpendicularly to the substrate in the impurity region of the substrate. An insulating interlayer is formed on the substrate including the dummy pattern to a sufficient thickness to cover the dummy pattern. The insulating interlayer is partially removed from the substrate until a top surface of the insulating interlayer is lower than a top surface of the dummy pattern, to thereby form the insulating interlayer pattern, so that an upper portion of the dummy pattern is protruded from the insulating interlayer pattern.

In an example embodiment, the capping layer pattern is formed as follows. A capping layer is formed on the insulating interlayer pattern to a thickness to cover the dummy pattern. The capping layer is then partially removed from the insulating interlayer pattern until a top surface of the dummy pattern is exposed. Otherwise, the capping layer pattern is also formed as follows: A capping layer is formed on the insulating interlayer pattern to a thickness to cover the dummy pattern. An etching process is performed against a whole surface of the capping layer until a top surface of the dummy pattern is exposed, thereby forming the capping layer pattern in such a structure that a group of the dummy patterns are surrounded by the capping layer pattern at the protruded upper portion of the dummy pattern.

In another example embodiment, the etch stop layer may be further formed on the dummy pattern and the spacer layer. Here, the etch stop layer comprises silicon nitride.

According to the method of manufacturing a semiconductor device in some embodiments, a contact plug in the contact hole is formed on the substrate through a reverse performance of a conventional self-aligned contact (SAC) process, thereby preventing damage to the gate structure in an etching process for formation of the contact hole. As a result, a thickness of the gate mask is significantly reduced.

The foregoing is illustrative of the invention and is not to be construed as limiting thereof. Although a few example embodiments of the invention have been described, those skilled in the art will readily appreciate that many modifications are possible in the example embodiments without materially departing from the novel teachings and advantages of the invention. Accordingly, all such modifications are intended to be included within the scope of the invention as defined in the claims. In the claims, means-plus-function clauses are intended to cover the structures described herein as performing the recited function and not only structural equivalents but also equivalent structures. Therefore, it is to be understood that the foregoing is illustrative of the invention and is not to be construed as limited to the specific example embodiments of the invention disclosed, and that modifications to the disclosed example embodiments, as well as other embodiments, are intended to be included within the scope of the appended claims. The invention is defined by the following claims, with equivalents of the claims to be included therein.

What is claimed is:

1. A method of manufacturing a semiconductor device, the method comprising:
    providing a substrate including impurity regions and a channel region between the impurity regions;
    forming a gate structure on the channel region of the substrate, the gate structure including a gate insulation layer pattern, a gate pattern and a mask pattern sequentially stacked on the channel region of the substrate;
    forming a spacer layer covering the gate structure;
    forming an insulating interlayer pattern on a resultant structure including the gate structure, the insulating interlayer pattern including a contact hole through which at least one of the impurity regions is exposed, wherein forming the insulating interlayer pattern includes:
        forming a dummy layer overlying the gate structure;
        forming a dummy pattern by patterning the dummy layer in such a way that the dummy layer remains on the impurity regions, the dummy pattern extending substantially perpendicularly to the substrate in the impurity region of the substrate;
        forming an insulating interlayer on the substrate including the dummy pattern to a sufficient thickness to cover the dummy pattern; and
        partially removing the insulating interlayer from the substrate until a top surface of the insulating interlayer is lower than a top surface of the dummy pattern, thereby forming the insulating interlayer pattern, an upper portion of the dummy pattern being protruded from the insulating interlayer pattern;
    forming a capping layer pattern on the insulating interlayer pattern, the capping layer pattern including an opening connected to the contact hole; and forming a conductive pattern to fill up the opening and the contact hole.

2. The method of claim 1, wherein forming the capping layer pattern includes:
   forming a capping layer on the insulating interlayer pattern to a thickness to cover the dummy pattern; and
   partially removing the capping layer from the insulating interlayer pattern until a top surface of the dummy pattern is exposed.

3. The method of claim 1, wherein forming the capping layer pattern includes:
   forming a capping layer on the insulating interlayer pattern to a thickness to cover the dummy pattern; and
   planarizing the capping layer until a top surface of the dummy pattern is exposed, thereby forming the capping layer pattern in such a way that a group of the dummy patterns are surrounded by the capping layer pattern at the protruded upper portion of the dummy patterns.

4. The method of claim 1, wherein forming the conductive pattern includes:
   forming the contact hole and the opening through which the impurity region is exposed by removing the dummy pattern and a portion of the spacer layer on the impurity region from the substrate;
   forming a conductive layer on the substrate including the capping layer pattern to a thickness to fill the contact hole and the opening; and
   partially removing the conductive layer from the substrate until a top surface of the capping layer pattern is exposed.

5. The method of claim 1, further comprising forming an etch stop layer on the dummy pattern and the spacer layer.

6. The method of claim 5, wherein the etch stop layer comprises silicon nitride.

7. The method of claim 1, wherein the dummy layer comprises a material having an etching selectivity with respect to the spacer layer and the insulating interlayer pattern.

8. The method of claim 7, wherein the dummy layer comprises polysilicon or silicon germanium.

9. The method of claim 1, wherein forming the gate structure comprises:
   sequentially forming a gate insulation layer, a gate layer and a mask layer on the channel region;
   patterning the mask layer to form the mask pattern on the gate layer; and
   partially etching the gate layer and the gate insulation layer, using the mask pattern as an etch mask, to form a gate insulation layer pattern and a gate pattern on the channel region,
   wherein a thickness ratio between the mask layer and the gate layer is in a range of about 1:2 to about 1:4.

10. The method of claim 1, wherein the spacer layer comprises silicon oxide.

11. The method of claim 1, wherein the capping layer pattern comprises silicon nitride.

12. The method of claim 5, wherein forming the insulting interlayer comprises forming the insulating interlayer on the etch stop layer.

* * * * *

UNITED STATES PATENT AND TRADEMARK OFFICE
CERTIFICATE OF CORRECTION

PATENT NO. : 7,553,748 B2  Page 1 of 1
APPLICATION NO. : 11/463812
DATED : June 30, 2009
INVENTOR(S) : Sung-Ho Jang et al.

It is certified that error appears in the above-identified patent and that said Letters Patent is hereby corrected as shown below:

Column 3, line 37, the word "case" should read -- ease --;
Column 6, line 30, the words "semi conductor" should read -- semiconductor --;
Column 7, line 57, the word "16" should read -- 116 --.

Signed and Sealed this

Twenty-ninth Day of September, 2009

David J. Kappos
*Director of the United States Patent and Trademark Office*